United States Patent [19]
Dister et al.

[11] Patent Number: 6,035,265
[45] Date of Patent: Mar. 7, 2000

[54] SYSTEM TO PROVIDE LOW COST EXCITATION TO STATOR WINDING TO GENERATE IMPEDANCE SPECTRUM FOR USE IN STATOR DIAGNOSTICS

[75] Inventors: Carl J. Dister, North Olmstead; Perry A. DelVecchio, Mentor, both of Ohio; Daniel N. Rogovin, Thousand Oaks, Calif.

[73] Assignee: Reliance Electric Industrial Company, Cleveland, Ohio

[21] Appl. No.: 09/135,208

[22] Filed: Aug. 17, 1998

Related U.S. Application Data

[63] Continuation-in-part of application No. 08/988,177, Dec. 10, 1997, and application No. 08/947,120, Oct. 8, 1997.

[51] Int. Cl.[7] .................................................. G01R 31/34
[52] U.S. Cl. ............................................. 702/183; 324/772
[58] Field of Search ..................................... 324/545, 546, 324/772; 338/823; 340/648; 702/57–59, 60, 64, 65, 76, 77, 81, 84, 182–183, 189–191

[56] References Cited

U.S. PATENT DOCUMENTS

| | | |
|---|---|---|
| 2,321,424 | 6/1943 | Rohats ..................................... 324/546 |
| 2,578,455 | 12/1951 | Seely ........................................ 324/703 |
| 2,609,419 | 9/1952 | Blair ......................................... 324/546 |
| 4,200,862 | 4/1980 | Campbell et al. . |
| 4,356,443 | 10/1982 | Emery ..................................... 324/546 |
| 5,257,006 | 10/1993 | Graham et al. . |
| 5,270,640 | 12/1993 | Kohler et al. ........................... 324/772 |
| 5,587,662 | 12/1996 | Kelley et al. ............................ 324/713 |

*Primary Examiner*—Marc S. Hoff
*Assistant Examiner*—Craig Steven Miller
*Attorney, Agent, or Firm*—Himanshu S. Amin; John J. Horn; John M. Miller

[57] ABSTRACT

A test procedure detects the onset of stator winding damage, identifies the failure mechanism, determines the winding's susceptibility to further damage, and predicts stator winding failure. This is accomplished by introducing a high frequency signal onto power lines which feed the stator and monitoring a change in the capacitance between the individual windings during introduction of the high frequency signal. In order to monitor the change in capacitance, a current sensor and voltage sensor are used to measure the current and voltage on the power lines during introduction of the high frequency signal. Changes in the capacitance between the individual stator windings are reflected as changes in the broadband impedance response of the stator windings which can be calculated by dividing the measured voltage by the measured current.

32 Claims, 12 Drawing Sheets

| FAILURE MECHANISMS | | | |
|---|---|---|---|
| MANUFACTURING | ELECTRICAL | THERMAL | MECHANICAL | ENVIRONMENTAL |
| CUT WINDING | DIELECTRIC | AGING | COIL MOVEMENT | MOISTURE |
| INCOMPLETE WEBBING | TRACKING | OVERLOAD | ROTOR STRIKE | CHEMICAL ABRASION |
| FAULTY CURING | CORONA TRANSIENTS | CYCLING | MISCELLANEOUS | FOREIGN OBJECTS |
Fig. 9
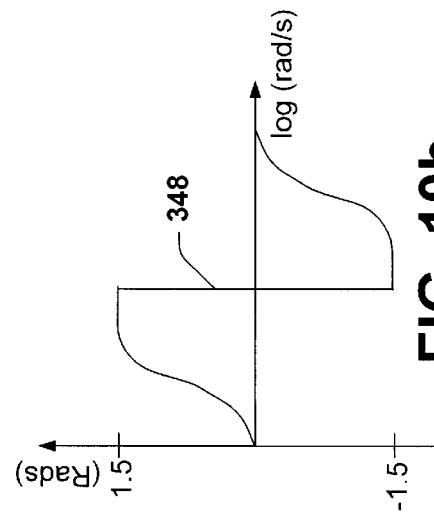
FIG. 10a
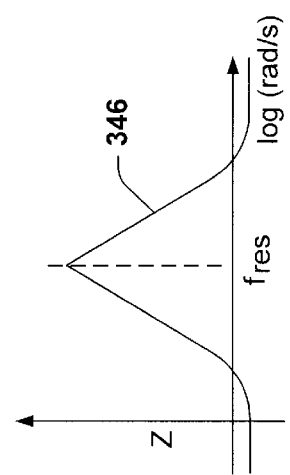
FIG. 10b
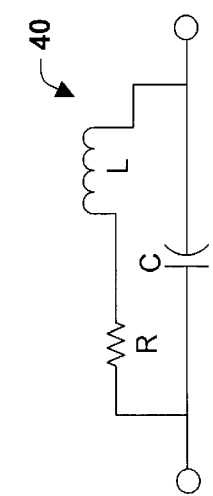
FIG. 7

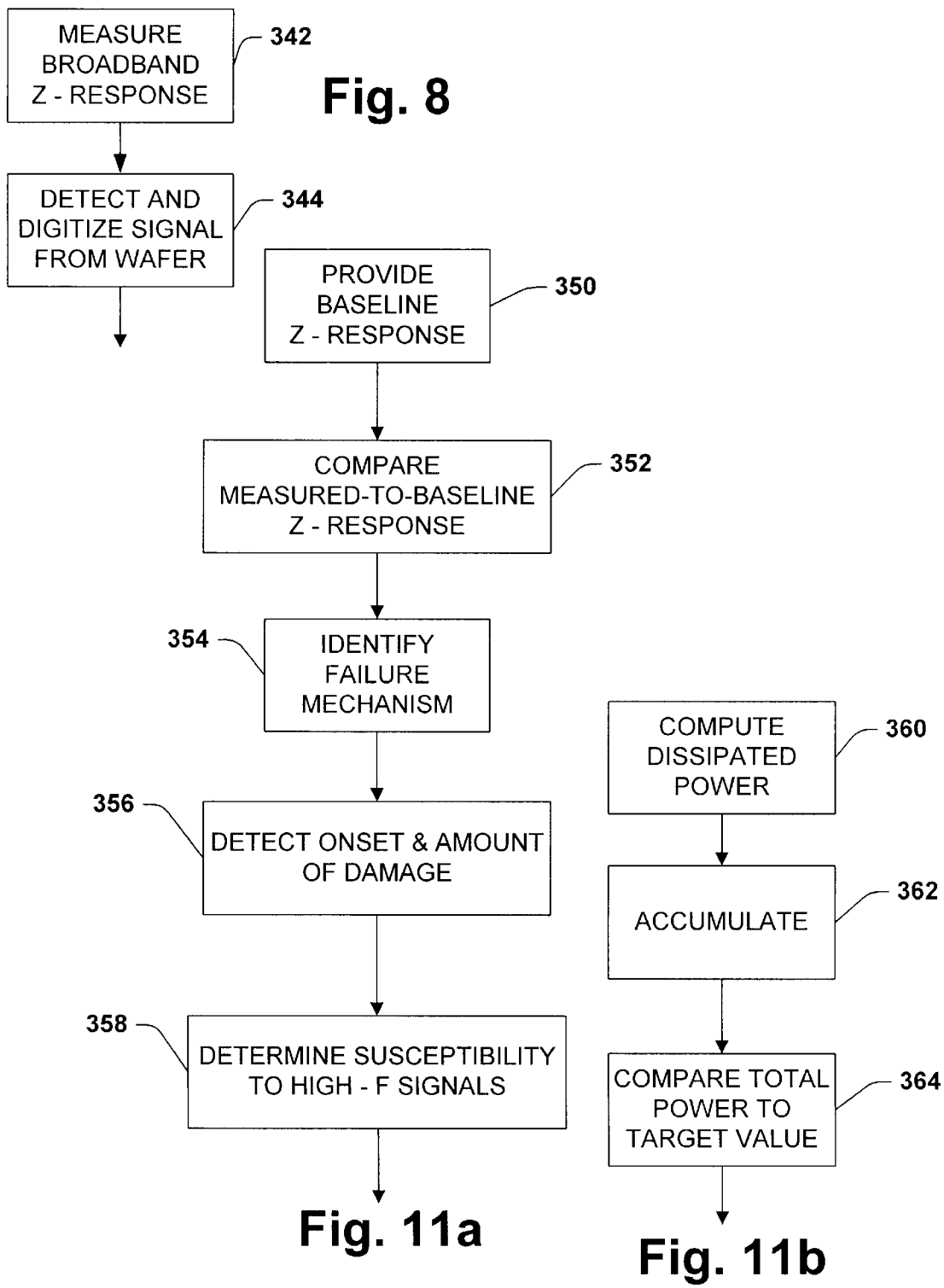

SYSTEM TO PROVIDE LOW COST EXCITATION TO STATOR WINDING TO GENERATE IMPEDANCE SPECTRUM FOR USE IN STATOR DIAGNOSTICS

CROSS REFERENCE TO RELATED APPLICATIONS

This application is a continuation-in-part of copending application Ser. No. 08/988,177, filed on Dec. 10, 1997 now pending and Ser. No. 08/947,120, filed on Oct. 8, 1997 now pending.

FIELD OF THE INVENTION

This invention relates to detecting stator winding damage in electric motors and more specifically to a method of detecting the onset of damage, identifying the failure mechanism, determining the susceptibility of windings to further damage, and predicting failure using broadband impedance measurements.

BACKGROUND OF THE INVENTION

Electric motors are used to convert electrical energy into mechanical energy. Permanent magnet field motors have low horsepower (hp) ratings and are used commercially for servo applications such as machine tools, robotics, and high-performance computer peripherals. Of particular interest are higher hp levels required in heavy industry and commercial production lines. For example, polyphase AC induction motors, primarily three-phase, are used to drive fans, pumps, and material handling devices. These motors operate at low frequencies, less than 2 kHz and typically at 60 Hz.

FIGS. 1a and 1b illustrate a 3-phase induction motor 10 that converts electrical energy into mechanical energy. As an aside, an induction motor can be operated as a generator which converts mechanical energy into electrical energy. The motor 10 includes a 3-phase stator winding 12 and three separate coils 14a, 14b, and 14c that are wound physically around a stator form 16 at 120 degree intervals and encapsulated in an insulator 18. Each coil includes a large number of wire strands 20 that are provided individually with an insulative sheath. The stator winding 12 is mounted inside a motor housing 22 and does not move. A rotor 24 is wound or provides means for a closed coil 26 and is mounted on a set of bearings 28 inside the stator winding 12. A drive shaft 30 extends axially from rotor 24 through motor housing 22.

Power delivered by an electric company to industrial plants for large motors is typically three-phase and is connected to drive coils 14a, 14b, and 14c. At low frequencies, the current flows through inductance coils of the motor 10 such that electrical energy is converted into mechanical energy. Specifically, the induced current flowing through the inductance coils produces a rotating magnetic field that cuts across rotor coil 26 inducing a circulating current in coil 26 that develops its own magnetic field in the rotor 24. Field intensifiers 32 are positioned around the interior of stator winding 12 to amplify its rotating magnetic field. The interaction between the rotating magnetic field and the rotor field produces the motor action that rotates shaft 30. Sinewave type motors drive the shaft at the line frequency, typically 60 Hz. Inverter type motors convert the fixed frequency line voltage into a controllable-frequency drive voltage so that the shaft can be rotated at different frequencies, typically less than 2 kHz.

In heavy industry and commercial production lines, unexpected motor failure disrupts the line, which wastes time and money. Further, this oftentimes results in discarded products, and may damage other online systems. The cost of reconditioning or replacing a motor is negligible compared to the expense associated with an unscheduled shut down. Consequently, commercial production lines routinely are shut down on a fixed maintenance schedule to test the motors and determine whether a component failure has occurred.

A 1985 Electric Power Research Institute (EPRI) study of failure modes in three phase induction motors revealed that 41% of the motors failed because of the rotor bearings, 37% failed due to problems associated with the stator winding insulation, 10% failed from rotor problems and 12% failed for a variety of other reasons. Although the dominant failure mode is bearing failure, stator winding insulation failure is the most significant from a user's perspective because its the most unpredictable. A stator winding failure may cause the performance of the motor to degrade or to fail entirely.

A 1985 brochure "Failure in Three-Phase Stator Windings" from Electrical Apparatus Service Association, Inc. (EASA) illustrated the typical winding failures in three-phase stators when exposed to unfavorable operating conditions—electrical, mechanical or environmental. Typical winding failures include a single-phase failure in which one phase of the winding is opened, phase-to-phase shorts, turn-to-turn shorts, winding grounded to the slot (intensifier), and thermal deterioration of insulation. Single-phase failures are usually caused by a blown fuse, an open contractor, broken power line or bad connections. The phase-to-phase, turn-to-turn and grounded winding failures result from contaminants, abrasion, vibration or voltage surges. Thermal deterioration is caused by imbalanced voltages, load demands exceeding the rating of the motor, locked rotor condition and power surges.

Current test procedures are conducted off line and coarsely measure degradation in the performance of the motor in its low frequency operating range, below 2 kHz, to detect the existence or non-existence of one of these failure modes in the stator winding. Based upon his or her experience, a technician decides whether a failure has occurred and what action to take. The risk is that the motor will fail or severely degrade before it is pulled off the line or that perfectly good motors will be rejected mistakenly. Known test procedures neither detect the onset of the damage that eventually causes one of these stator winding failures, identify the failure mechanism responsible for the damage, determine the susceptibility of the windings to further damage, nor predict when failure will occur.

Typically, motors are subjected to partial discharge and surge tests to detect a stator winding failure. In the partial discharge test, a technician discharges a capacitor across the stator winding and observes the time domain voltage response to detect spikes on the 60 Hz envelope. The magnitude of the spikes is a rough indicator of stator winding damage. In the surge test, a technician applies a large voltage pulse to each phase of the winding and compares their time domain current responses to detect asymmetry that is indicative of damage. At best these tests detect whether a failure has occurred, neither is sensitive enough to detect the onset and progression of damage to the winding prior to an actual failure.

SUMMARY OF THE INVENTION

In view of the above problems, the present invention provides a broadband test procedure for detecting the onset of stator winding damage, identifying the failure mechanism, determining the susceptibility of the windings to further damage, and predicting stator winding failure.

This is accomplished by realizing that changes in the stator winding insulation and/or geometry are reflected as changes in the capacitance between the individual windings and, hence, as changes in the broadband impedance response of stator winding. These changes may indicate different types of damage to the winding that can cause failure. Furthermore, the broadband impedance response reveals the vulnerability of stator windings to further damage from high frequency signals far above the operating frequency of the motor that are typically associated either with line surges or inverter driven motors.

To detect this damage and predict failure, the stator winding is probed at frequencies substantially above its normal operating range where the winding current has a substantial capacitive component that flows between the individual windings and is dissipated in the insulation. The winding may be probed by injecting high frequency test signals into the stator winding preferably using an X-10 chip or the like. Alternatively, the winding may be probed using existing high frequency signals common to inverter motors. During the injection of the high frequency signals, the impedance on the windings is monitored. For instance, a voltage sensor and current sensor may be coupled to power lines feeding the windings to determine an impedance therein (impedance=voltage/current).

Changes in the broadband impedance response indicate the onset of insulation damage and may identify a particular failure mechanism. The susceptibility of the stator winding to further damage from high frequency waveforms is based on the current value and trend of the impedance response. Furthermore, the impedance response can be used to compute the total dissipated power into the insulation. Any one of these factors or a combination thereof can be used to predict stator winding failure.

According to one aspect of the present invention, a system for predicting stator winding damage in a motor is provided. The system includes a signal generator coupled to a power line providing power to the motor, the signal generator introducing a high frequency signal on the power line and a sensor coupled to the power line, the sensor monitoring electrical characteristics of the power line during the introduction of the high frequency signal to facilitate a determination of an impedance of the power line.

According to another aspect of the present invention, a device for detecting stator winding damage in a motor is provided. The device includes a high frequency signal generator coupled to a power line providing power to the motor, the signal generator introducing a high frequency signal on a power line. The device further includes a current sensor coupled to the power line for sensing the current passing through the power line, a voltage sensor coupled to the power line for sensing the voltage on the power line, and circuitry for calculating the impedance of the power line based on the sensed current and the sensed voltage.

According to another aspect of the present invention, a system for predicting stator winding damage in a motor is provided. The system includes means for introducing a high frequency signal on a power line providing power to the motor, and means for determining an impedance of the power line during introduction of the high frequency signal.

According to another aspect of the present invention a dynamoelectric machine diagnostic module adapted to be integrally mounted to a dynamoelectric machine is provided. The dynamoelectric machine diagnostic module includes means for receiving current information from a current sensor, means for receiving voltage information from a voltage sensor, and a microprocessor operatively coupled to the means for receiving current information and the means for receiving voltage information, the microprocessor processing the current information and the voltage information to facilitate determining of an impedance of the machine for assessing a health of the machine.

According to still another aspect of the present invention, a system for determining an operating state of a dynamoelectric machine is provided. The system includes a host computer operatively coupled to a network, a high frequency signal generator for generating high frequency signals to be introduced to power lines feeding the machine, a voltage sensor coupled to the power line for sensing a voltage on the power line, a current sensor coupled to the power line for sensing a current passing through the power line, a microprocessor operatively coupled to the voltage sensor and the current sensor, the microprocessor processing the sensed voltage and the sensed current to facilitate determining an impedance of the power line, and a communications system adapted to enable communication between the microprocessor and the host computer.

According to yet still another aspect of the present invention, a method of determining an operating state of a motor is provided. The method includes the steps of introducing a high frequency signal on a power line providing power to the motor, and determining an impedance of the power line in conjunction with introducing of the high frequency signal.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 7 is a zeroth order model of the broadband impedance of the stator winding of the present invention;

FIG. 8 is a flowchart illustrating a method of detecting the onset of winding damage and predicting failure using broadband impedance measurements in accordance with the present invention;

FIG. 9 is a table of failure mechanisms that cause stator winding insulation damage and eventual failure;

FIGS. 10a and 10b are respectively the zeroth order broadband impedance and phase responses for the model shown in FIG. 6;

FIGS. 11a and 11b are respectively flowcharts illustrating a method for predicting stator winding failure based on the comparison of the broadband impedance response to a baseline response and the total power dissipated in the stator winding to a target value;

DETAILED DESCRIPTION OF THE INVENTION

Figure 1A:
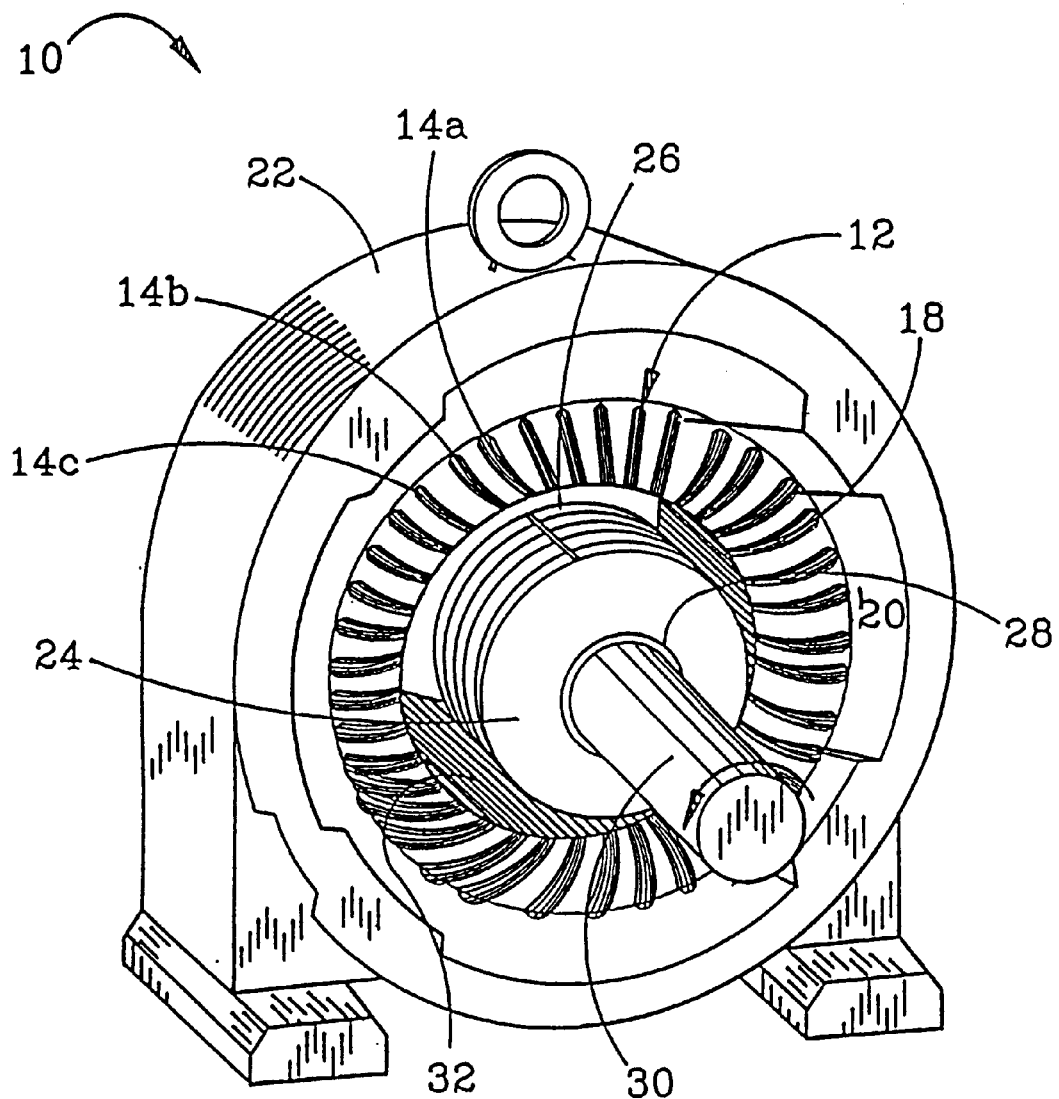
FIGS. 1a and 1b, are respectively sectional views of a known 3-phase induction motor and its unwound stator.

The present invention will now be described with reference to the drawings, wherein like reference numerals are used to refer to like elements throughout.

As is mentioned above, the present invention provides a method of conducting a broadband test to detect the onset of stator winding damage, identify the failure mechanism, determine the winding susceptibility to further damage, and predict stator winding failures of the type described in the EASA brochure.

In most cases, stator winding insulation failure is either a direct consequence of dielectric breakdown or changes in the winding geometry. Applicants realized that changes in the dielectric or geometry are reflected as changes in capacitance between the individual stator windings and hence as changes in the broadband impedance response of the stator windings. Thus, a change in impedance response can be used to detect the onset of damage and predict winding failure. To detect these changes, the stator winding must be probed over a broad frequency band substantially above its normal operating range where the capacitive component becomes significant. Furthermore, the impedance response can be used to compute the dissipated power in the insulation. Preferably, the present invention utilizes a high frequency signal generator coupled to each power line feeding a motor to introduce high frequency signals thereon during operation. A voltage sensor and current sensor are preferably coupled to each power line so as to provide a processor with the sensed voltage and sensed current on the power lines during the introduction of the high frequency signal. The processor in turn calculates the impedance (impedance= voltage/current) on the power lines during application of the high frequency signal which is used to determine the health of the stator winding as will now be discussed in more detail.

Figure 2:
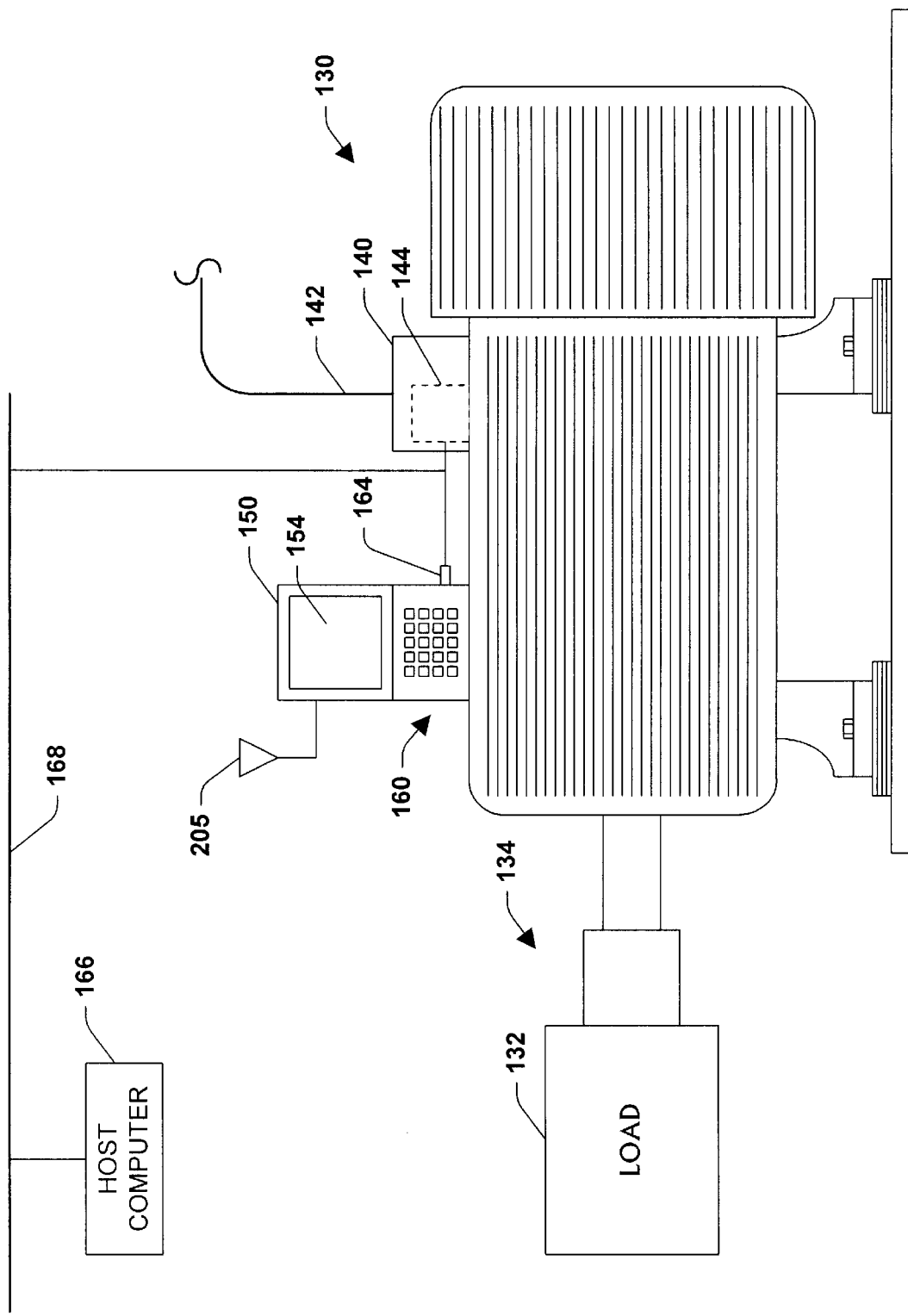
FIG. 2 is a functional schematic diagram of an integrated AC induction motor, interface device and diagnostic module in accordance with one specific aspect of the present invention.
Figure 3:
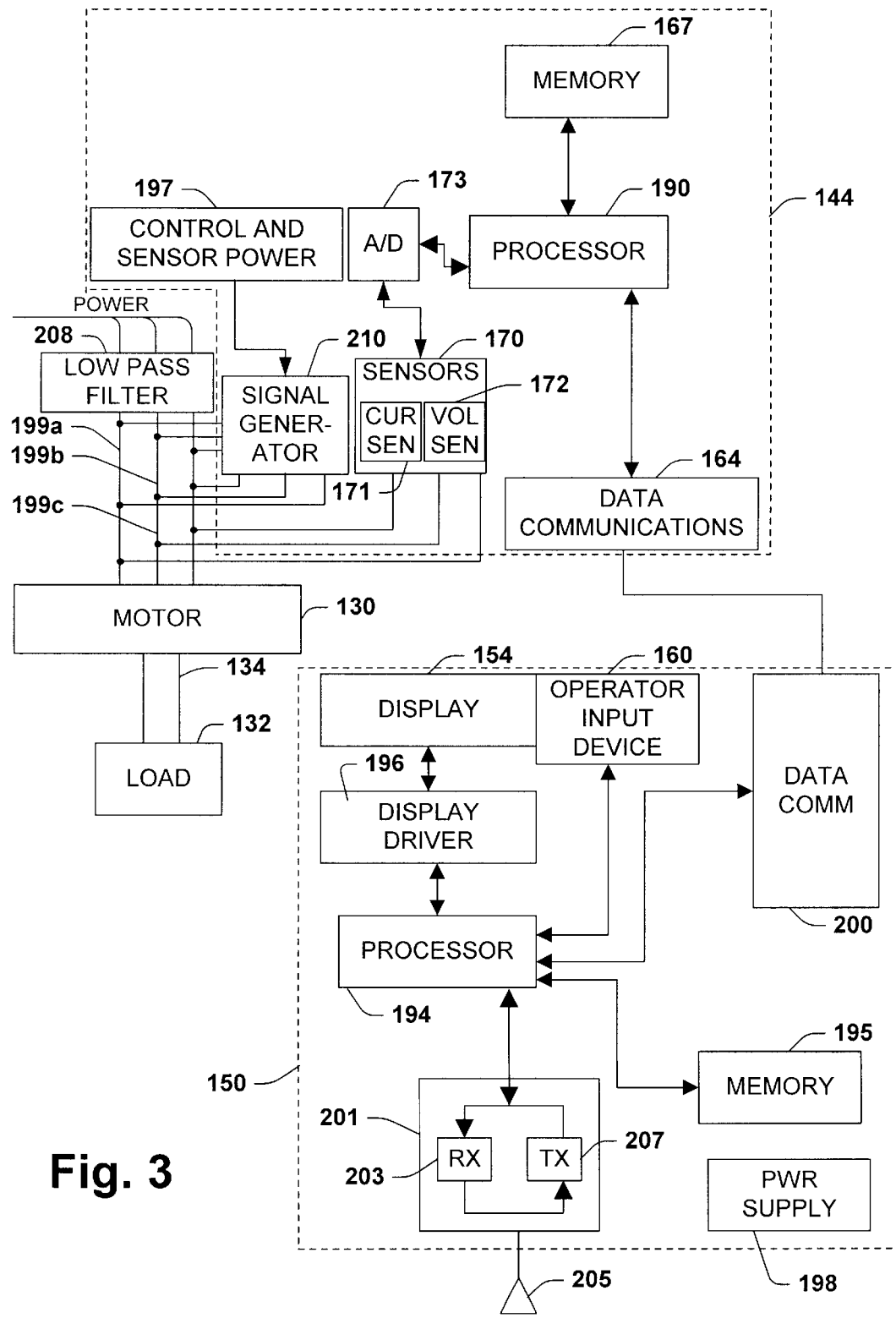
FIG. 3 is a block diagram of a current and voltage sensor, signal conditioning circuit, and the interface device of FIG. 2.

Referring now to FIGS. 2 and 3, one specific environment in which the present invention may be employed is shown.

A three-phase ac induction motor 130 is depicted driving a load 132 through a shaft coupling 134. The motor 130 includes a junction box 140 for receiving conductors from power lines via a conduit 142, which are tied to power supply lines 199 (FIG. 2) of the motor 130. The motor 130 is AC powered and operates at an AC power line frequency of 60 Hz, however, it is appreciated that different line frequencies (e.g., 50 Hz) may be employed. Further, it will be appreciated that the present invention is suitable for use with other types of motors 130 such as DC brush motors, DC brushless motors, synchronous motors, stepper motors, and switch reluctance motors.

Mounted inside the junction box 140 is a motor diagnostic module 144 which, as will be discussed in greater detail below, provides for receiving and processing data relating to the health of the motor 130. Coupled to the motor 130 and motor diagnostic module 144 is an interface device 150. The interface device 150 includes a display 154 for displaying to an operator information relating to the operation of the motor 130. The interface device 150 further includes an operator input device 160 in the form of a key pad 160 which enables a user to enter data, information, function commands, etc. as is conventional. For example, the user may input information relating to motor status via the keypad 160 for subsequent transmission to a host computer 166. In addition, the keypad 160 may include up and down cursor keys for controlling a cursor which may be shown on the display 154. The interface device 150 includes a communications port 164 for interfacing the interface device 150 with the motor diagnostic module 144 and the host computer 166 via a suitable communications link.

According to a preferred aspect of the present invention, the motor diagnostic module 144 is part of a communication system including a network backbone 168. The network backbone 168 may be a hardwired data communication path made of twisted pair cable, shielded coaxial cable or fiber optic cable, for example, or may be wireless or partially wireless in nature. Information is transmitted via the network backbone 168 between the host computer 166, the interface device 150 and the diagnostic module 144. The communication link preferably adheres to the RS232C or DeviceNet standard for communicating command and parameter information. However, any communication link suitable for carrying out the present invention may be employed. It is to be appreciated that the interface device 150 may be integrated with the motor diagnostic module 144.

Referring now in particular to FIG. 3, a schematic representation is shown according to one particular aspect of the present invention, wherein the motor diagnostic module 144 is integrated with the three phase induction motor 130 and the interface device 150. However, it will be appreciated from the discussion herein that the interface device 150 may be located remotely from the motor 130. Furthermore, it is to be appreciated that the diagnostic module 144 may serve to carry out substantially all of the functions described herein performed by the interface device 150 and/or the host computer 166.

The induction motor 130 includes the load 132 at the front end thereof. The output shaft 134 connects the load 132 to the motor 130. The load 132 may be any device or article typically driven by the motor 130 such as a pump, for example. The motor diagnostics module 144 is coupled to the motor 130 in a suitable manner. In the preferred embodiment, the module 144 is mounted in the conduit box 140 which is attached to the motor housing. The enclosure (e.g., conduit box 140) used to house the diagnostic module 144 is suitably weatherproofed to protect the diagnostic module 144 from whatever environment (e.g., dust, moisture, heat, etc.) the motor 130 is operating. For example, the interior of the enclosure 144 may be suitably insulated with thermal insulation so as to protect the diagnostic module 144 from heat generated by the motor 130.

Three phase power is provided to the motor 130 via power supply lines 199a, 199b, 199c (collectively referred to as power supply lines 199). Prior to entering the motor 130, the power supply lines 199 are each directed through an optional low pass filter 208. The low pass filter 208 serves to filter out high frequency signals from the power lines 199 while passing the low frequency (e.g. 60 Hz) power signals to the motor 130. In this manner, stray or unaccounted for high frequency signals are filtered from the power lines 199 prior to the introduction of controlled high frequency signals from signal generator 210. While the optional low pass filter 208 of the present embodiment is shown to be outside of the module 144, it will be appreciated that, if included, the low pass filter 208 may alternatively be incorporated into the module 144 or placed at other suitable locations.

The signal generator 210 is included in the module 144 and is coupled to each of the power supply lines 199 between the low pass filter 208 and the motor 130. The signal generator 210 introduces a high frequency signal to each of the power supply lines 199 to facilitate sensing the impedance on each line. In the present embodiment, the signal generator 210 introduces a signal having a frequency in the 100 kHz range to each of the power supply lines 199. It will be appreciated, however, that other frequencies (e.g 80–150 kHz) which do not interfere significantly with the low frequency power supply signals may alternatively be used. The signal generator 210 is controlled via the processor 190 to introduce the high frequency signals to the power supply lines 199 either at predetermined intervals or continuously. In the present embodiment, the high frequency signals are introduced at intervals which correspond to a zero cross over point for the 60 Hz power signal on each power supply line 199. While the signal generator 210 of the present embodiment is shown to be included as part of the module 144, it will be appreciated that the signal generator 144 may operate independent and apart from the module 144 and/or in conjunction with other circuitry associated with the motor 130.

Figure 4:
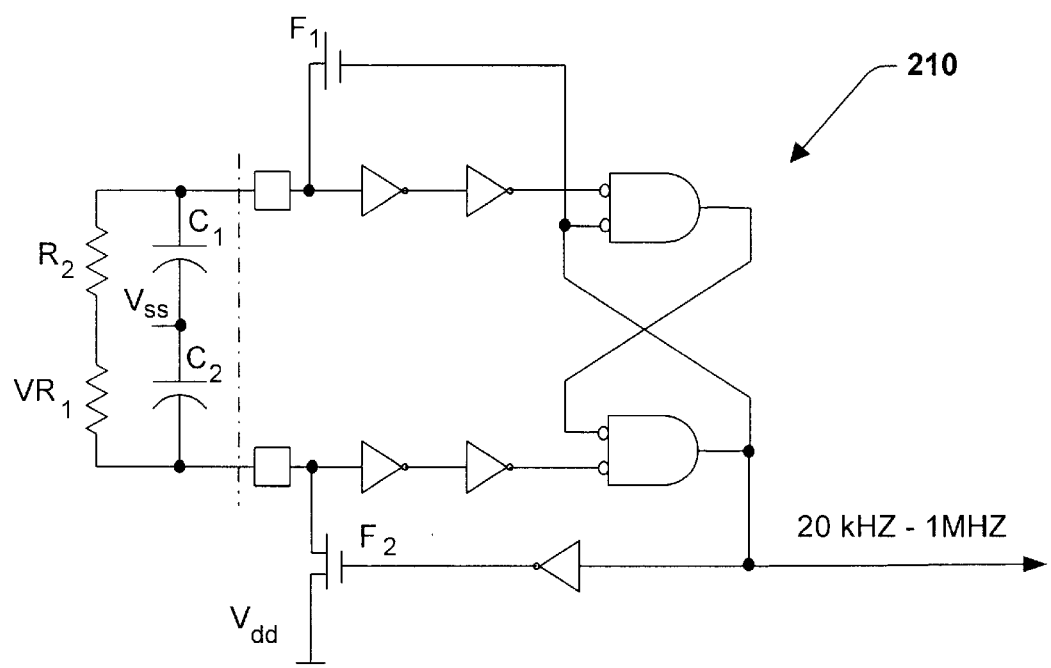
FIG. 4 is a circuit diagram of a high frequency signal generator of the present invention.

Turning briefly to FIG. 4, a circuit diagram depicting one configuration of the signal generator 210 is shown in more detail. As mentioned above, the signal generator 210 serves to provide a high frequency signal on each of the power lines 199 for the purpose of measuring the impedance to help predict the onset of a fault condition in the stator winding. The signal generator 210 produces a stable a.c. waveform adjustable over a range of frequencies, for example, between 20 kHz and 1 MHZ. The frequency produced by the signal generator 210 is governed by resistors $R_2$, $VR_1$, and capacitors $C_1$ and $C_2$. Adjustability of the frequency is provided for by variable resistor $VR_1$. Power is supplied to the signal generator 210 by way of DC voltage power inputs $V_{SS}$ and $V_{DD}$ through FET transistors $F_1$ and $F_2$. A signal generator 210 such as that described above is discussed in U.S. Pat. No. 4,200,862 to Campbell et al., the entire disclosure of which is hereby incorporated by reference. Although one signal generator circuit is shown in FIG. 4, it will be appreciated that the signal generator 210 of the present embodiment includes three of such circuits to provide high frequency signals on each of the power lines 199a, 199b, and 199c, respectively. For example, in the present embodiment the signal generator 210 includes three X-10 signal generator chips which are commercially available from X-10, Inc., in Closter, N.J. The X-10 signal generator chips are easy to integrate and provide a low cost alterative for producing the high frequency signals on each of the power lines 199 over conventional techniques.

Returning to FIG. 3, a plurality of sensors 170 are coupled to various parts of the motor 130. The sensors 170 include a current sensor 171 and a voltage sensor 172 which are each tied to all three phases of the input power lines 199 of the motor 130. The sensors 170 of the present embodiment are shown to be included as part of module 144, however, it will be appreciated that the sensors 170 alternatively may be located independent of the module 144. As will be described in more detail below, the current sensor 171 and voltage sensor 172 sense the corresponding current and voltage used to calculate the impedance on each of the power lines 199 during the introduction of a high frequency signal by the signal generator 210. The calculated impedance (impedance=voltage/current) is used to predict stator winding failure. The sensors 170 may further include temperature sensors (e.g., thermocouples), vibration sensors (e.g., accelerometers), encoders, and other measuring devices for monitoring the operation of the motor 130 as described in co-pending U.S. patent application Ser. No. 08/988,177 titled Dynamoelectric Machine Diagnostic Module the entire disclosure of which is hereby incorporated by reference.

The sensors 170 are tied to multi-channel analog-to-digital (A/D) converter 173 of the module, which converts the analog signals provided by the various sensors to digital form. The analog-to-digital converter 173 provides a processor 190 with digitally converted signals corresponding to the analog signals provided by the sensors 170.

The processor 190 is responsible for controlling the general operation of the diagnostic module 144. The processor 190 is programmed to control and operate the various components within the diagnostics module 144 in order to carry out the various functions described herein. The processor or CPU 190 can be any of a plurality of suitable processors, such as the p24T, Pentium 50/75, Pentium 60/90, and Pentium 66/100, Pentium PRO and Pentium II, Motorola MC68HC16Z1 CFC16 and other similar and compatible processors. The manner in which the processor 190 can be programmed to carry out the functions relating to the present invention will be readily apparent to those having ordinary skill in the art based on the description provided herein and thus further discussion related thereto is omitted for sake of brevity.

A memory 167 tied to the processor 190 is also included in the motor diagnostics module 144 and serves to store program code executed by the processor 190 for carrying out operating functions of the motor diagnostics module 144 as described herein. The memory 167 also serves as a storage medium for temporarily storing information such as motor current data, motor voltage data, vibration analysis data, motor temperature data, motor voltage data, shaft rotation data, and the like. The memory 167 may also include machine specific data which is used to facilitate machine diagnosis.

The memory 167 includes read only memory (ROM) and random access memory (RAM). The ROM contains among other code the Basic Input-Output System (BIOS) which controls the basic hardware operations of the motor diagnostics module 144. The RAM is the main memory into which the operating system and application programs are loaded.

Power is provided to the processor 190 and other components forming the diagnostic module 144 from a control and sensor power system 197. However, it will be appreciated that such power could be obtained from the motor power leads 199 themselves via power converting circuitry (not shown).

The diagnostics module 144 includes a data communication system 164 which includes a data communication port and communications card (not shown), which is employed to interface the processor 190 with the interface device 150 and/or the host computer 166 via the network 168 (FIG. 2). The communication link preferably adheres to the RS232C or DeviceNet standard for communicating command and parameter information. However, any communication link suitable for carrying out the present invention may be employed.

It should be appreciated that the present invention may be used in a system which does not include an interface device 150 and host computer 166. All processing including data analyses and motor state estimation and health determination could be accomplished by the processor 190 and the results transmitted to a PC or a control computer such as a programmable logic controller (PLC) (not shown). Furthermore, only one data link may be required. According to another embodiment, the processor 190 could be employed to simply trigger a single bit, digital output which may be used to open a relay and turn the motor 130 off.

The interface device 150 also includes a processor 194 responsible for controlling the general operation of the interface device 50. The processor 194 is programmed to control and operate the various components within the interface device 150 in order to carry out the various functions described herein. The processor or CPU 194 can be any of a plurality of processors, such as the p24T, Pentium 50/75, Pentium 60/90, and Pentium 66/100, Pentium PRO and Pentium II, and other similar and compatible processors. The manner in which the processor 194 can be programmed to carry out the functions relating to the present invention will be readily apparent to those having ordinary skill in the art based on the description provided herein.

A memory 195 tied to the processor 194 is also included in the interface device 150 and serves to store program code executed by the processor 194 for carrying out operating functions of the interface device 150 as described herein. The memory 195 is adapted to store a complete set of the information to be displayed. According to a preferred embodiment, the memory 195 has sufficient capacity to store multiple sets of information, and the processor 194 could include a program for alternating or cycling between various sets of display information. This feature enables the display 154 to show a variety of effects conducive for quickly conveying motor state information to a user.

The memory 195 includes read only memory (ROM) and random access memory (RAM). The ROM contains among other code the Basic Input-Output System (BIOS) which controls the basic hardware operations of the interface device 150. The RAM is the main memory into which the operating system and application programs are loaded.

The display 154 is coupled to the processor 194 via a display driver circuit 196 as is conventional. The display 154 may be a liquid crystal display (LCD) or the like. In the preferred embodiment, the display 154 is a fine pitch liquid crystal display operated as a standard CGA display with a resolution of 640×200 pixels. The display 154 functions to display data or other information relating to ordinary operation of the motor 130. For example, the display 154 may display a set of discrete motor condition indicia such as, for example, fault indicia, caution indicia, and normal operation indicia which is displayed to the operator and may be transmitted over the network 168. Additionally, the display 154 may display a variety of functions that are executable by the motor 130. The display 154 is capable of displaying both alphanumeric and graphical characters.

Power is provided to the processor 194 and other components forming the interface device 150 from a power supply 198. However, it will be appreciated that such power could be obtained from the motor power leads 199 themselves via the diagnostic module 144.

The interface device 150 includes a communication subsystem 200 which includes a data communication port, which is employed to interface the processor 194 with the motor diagnostics module 144 and/or the host computer 166. The interface device 150 also includes its own RF section 201 connected to the processor 194. The RF section 201 includes an RF receiver 203 which receives RF transmissions from the host computer 166 for example via an antenna 205 and demodulates the signal to obtain digital information modulated therein. The RF section 201 also includes an RF transmitter 207 for transmitting information to the network backbone 168 or host computer 166 for example in response to an operator input at input device 160.

Figure 5:
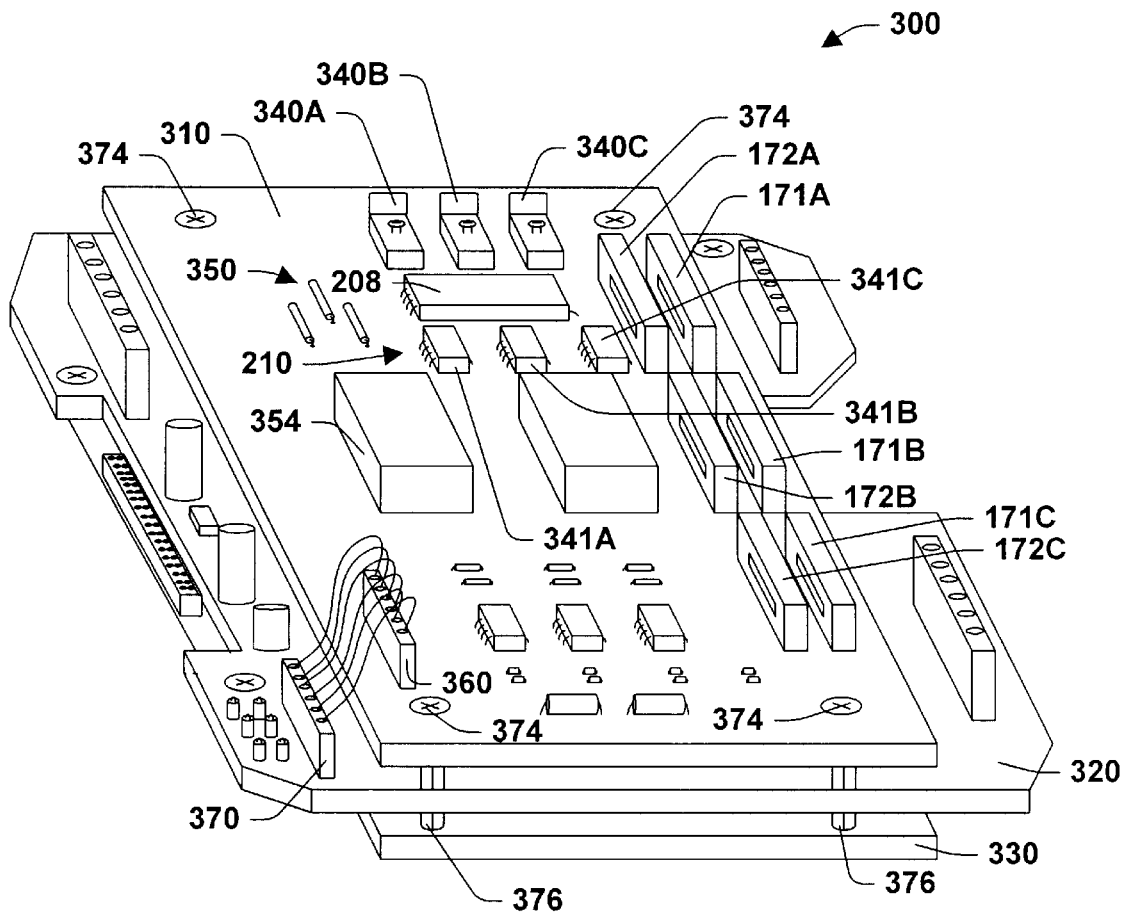
FIG. 5 is a detailed perspective illustration of a stacked circuit board arrangement of the diagnostic module of FIG. 2.

Turning now to FIG. 5, a detailed perspective illustration of a stacked circuit board arrangement 300 of the diagnostic module 144 is shown in accordance with one specific aspect of the present invention. The stacked circuit board arrangement 300 includes a power board 310 located on the top of the stack 300, an analog to digital (A/D) converter board 320 below the power board 310, and a processor/memory board 330 below the A/D board 320.

The power board 310 includes three contacts $340_A$, $340_B$, and $340_C$ (hereinafter collectively referred to as contacts 340) for receiving 3-phase input power from the power lead wires 199 to supply power to the motor 30. Each phase is passed through the low pass filter 208 as discussed above with respect to FIG. 2. Following low pass filtering, each phase is coupled via the power board 310 to the signal generator 210 which in the present embodiment is three X-10 chips $341_A$, $341_B$, and $341_C$ (hereinafter collectively referred to as X-10 chips 341). The X-10 chips 341 each serve to introduce a 100 kHz signal on the respective phase of the input power wire. The wires are then fed to the motor 130 to supply operating power. As discussed above with respect to FIG. 2, the current sensors $171_A$, $171_B$, and $171_C$ and voltage sensors $172_A$, $172_B$, and $172_C$ also are coupled to the power lines (one current sensor/voltage sensor per phase) for monitoring the current and voltage to provide data for determining the impedance of each.

The power board 310 also includes a resistive divider network 350 for stepping down the voltage of the input power for powering low voltage instrumentation. The resistive divider network 350 also includes two step down transformers 354. The power board also includes the signal conditioning system 106. A signal connector 360 provides for sending the analog signals of the power board 310 to the A/D board 320.

The signal connector 360 is shown wired to a signal connector 370 of the A/D board 320. In this manner, the analog signals (e.g., current sensor 171 signals) of the power board 310 to the A/D board for conversion to digital form. The power board 310, the A/D board 320 and the processor/memory board 330 are secured together via screws 374 and bolts 376. Additional details related to the power board 310, A/D board 320 and processor/memory board 330 are provided in U.S. patent application Ser. No. 08/988,177 now pending which has been incorporated by reference above.

Figure 6:
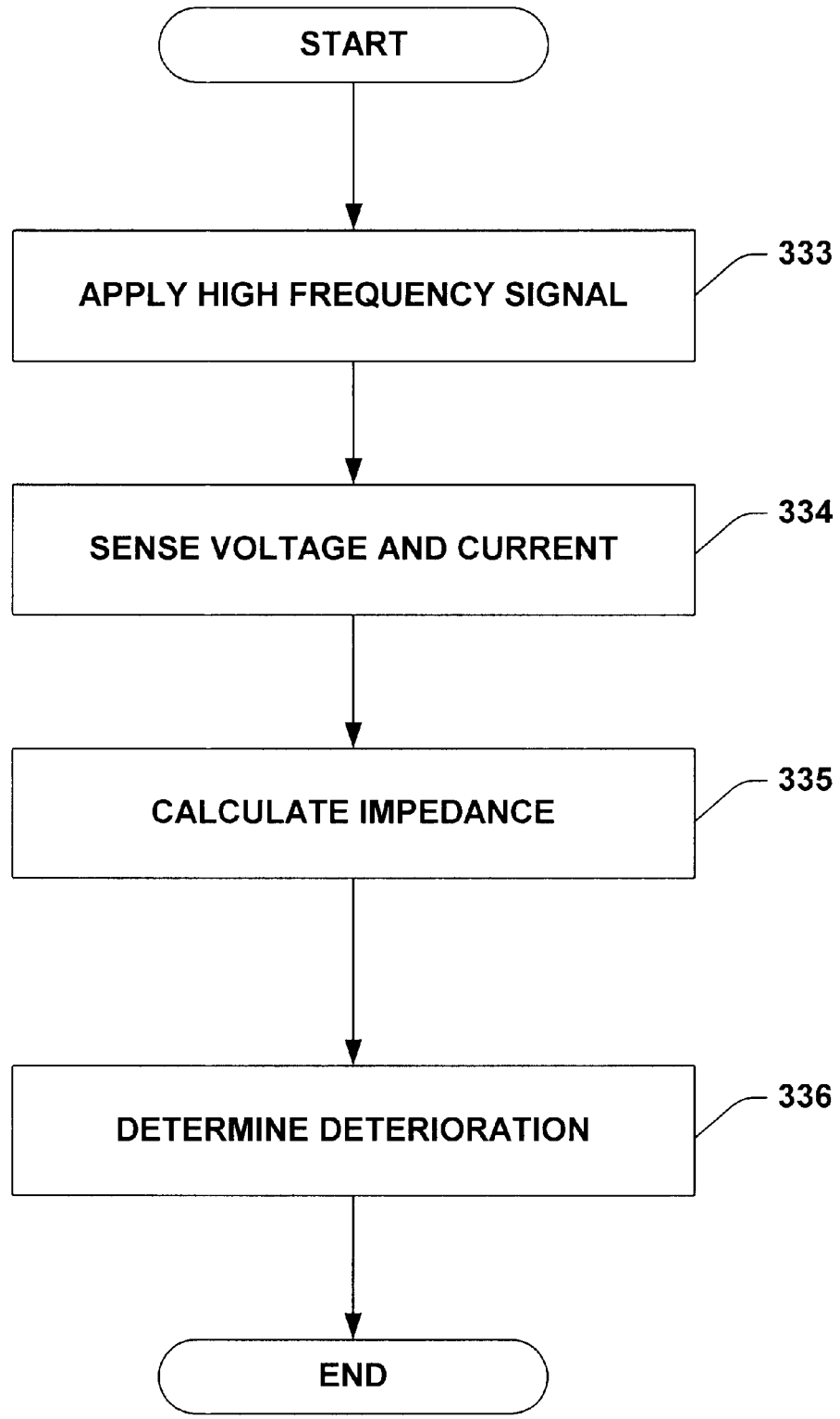
FIG. 6 is a flowchart illustrating the general operations related to measuring impedance on a power line during the application of a high frequency from the high frequency signal generator.

Turning now FIGS. 6–11, additional details related to how stator winding damage is predicted using the impedance calculations discussed above is provided. More particularly, in FIG. 6 an overview of the operations of the present invention is depicted. As discussed above, in order to predict stator winding failure, the present invention introduces a high frequency signal on each power line 199 and then measures the impedance response which is indicative of the stator winding health. By injecting a high frequency signal of the order of 100 kHz, the impedance response can be measured without interfering with the lower frequency (e.g. 60 Hz) power signals. Thus, as shown in FIG. 6, at step 333 the processor 190 periodically controls the signal operator 210 to apply a high frequency signal (e.g. 100 kHz) on each power line 199. During application of the high frequency signal, the processor 190 also controls the current sensor 171 and voltage sensor 172 to sense the current and voltage, respectively, on each power line 199. Next, in step 335 the processor 190 receives the sensed current and voltage and calculates an impedance for each power line 199. Based on a comparison of the calculated impedance to a known impedance of healthy stator windings, the processor 190 is able to provide a user with feedback concerning the condition of stator windings in step 336.

Figure 1B:
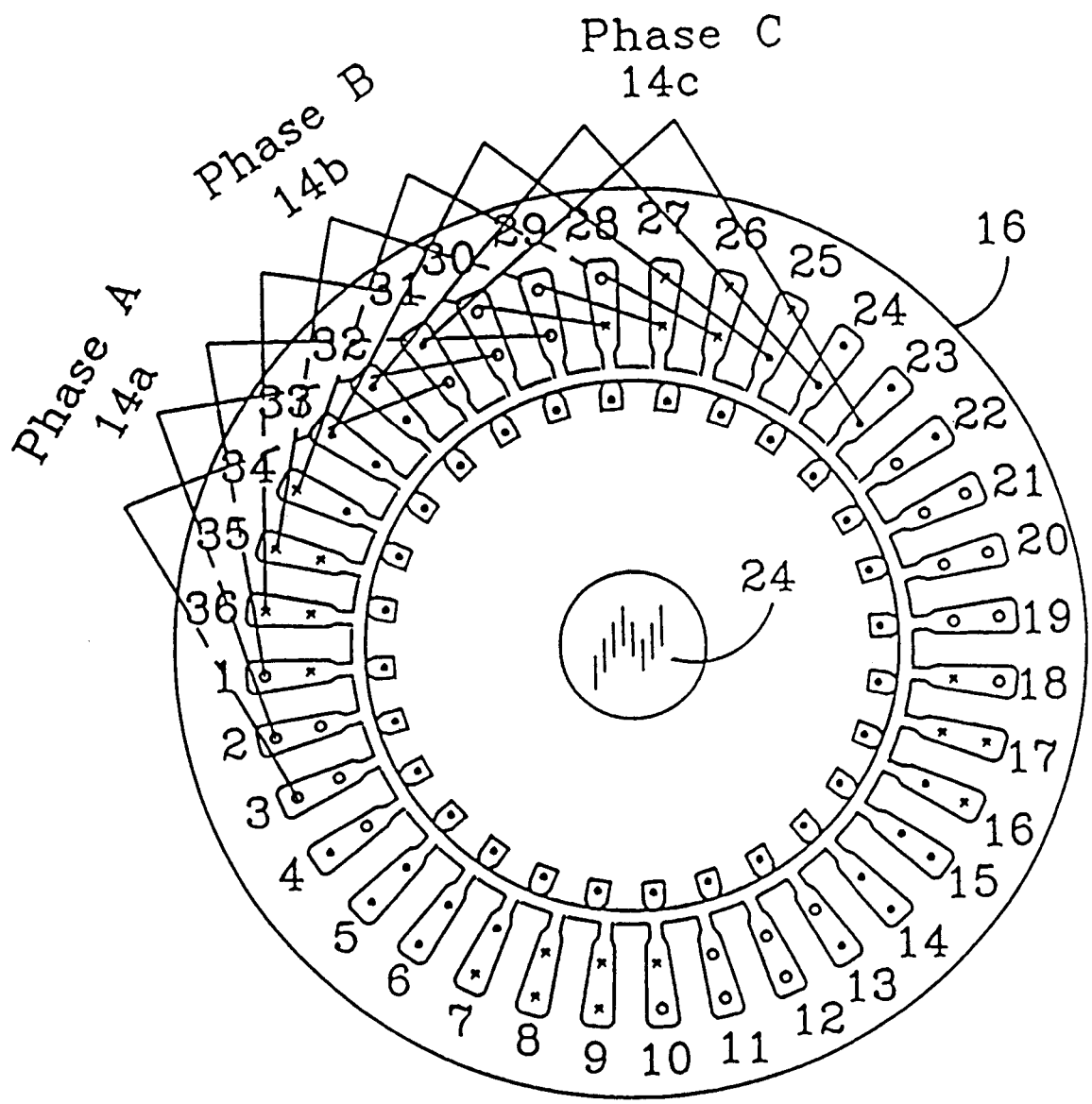

In order to better appreciate how the introduction of high frequency signals facilitates determining the health of the stator windings, FIG. 7 shows a zeroth order broadband electrical model 40 of the stator winding 12 shown in FIGS. 1a and 1b. The model includes an inductor L that represents the inductance of the stator winding connected in series with a resistor R that represents the resistance of the stator winding. This series R-L circuit is the conventional model used to analyze the stator and is accurate in the operating frequency range of the motor. At low frequencies, the current flows through the motor inductance and gives rise to the power conversion from electrical energy to mechanical energy that spins the rotor.

A stator winding failure may produce a measurable change in either the resistance or inductance at these low frequencies. However, mere damage to the insulation prior to actual failure will not produce a measurable change in these parameters or the impedance response of the motor. Thus, the failure mechanism cannot be identified nor failure predicted based upon this model.

Applicants have enhanced the conventional model by connecting a capacitor C that represents the capacitance between the individual stator windings in parallel with the series R-L circuit. At frequencies in the operating frequency range of the motor, the capacitor is effectively an open circuit such that the model defaults to the conventional series R-L circuit. However, at high enough frequencies the winding current has a significant capacitive component that flows between the individual windings as well as the stator metal core where it is converted into thermal energy and dissipated into either the insulation or the metal core. As a result, changes, e.g. damage, to the stator winding insulation that change its dielectric constant or its geometry will produce a measurable change in the broadband impedance response of the motor.

As illustrated in FIG. 8, in one sense, the invention teaches measuring the broadband impedance response of the stator windings (step 342) and, based upon the impedance response, predicting stator winding failure (step 344).

How the impedance response is measured depends upon the particular application. For example, manufacturing defects of the type listed in FIG. 9 typically induce a relatively small change in the impedance response. Therefore, newly manufactured motors are preferably tested off-line where the frequency of the probe signal can be swept across the broadband to resolve finely the impedance. Conversely, the degradation caused by the electrical, thermal, mechanical and environmental failure mechanisms of the type also listed in FIG. 9 typically cause a significant degradation. As a result, the impedance response can be generated by probing the stator winding with a discrete set of frequencies using a signal generator such as signal generator 210 and then interpolating over the broadband. Although this approach provides less resolution, it has the advantage of not having to shut the line down. The stator winding can be probed by injecting high frequency signals, for example using the X-10 chip, or by using the existing high frequency components of the driver waveform. Alternately, a current pulse can be injected into the windings and the impedance response calculated using a FFT.

The broadband impedance response is measured at frequencies above the operating frequency range of the motor where the winding current has a significant capacitive component, typically above approximately $0.3 \times F_{res}$ where $F_{res}=1/(L \times Re[C])^{1/2}$ is the resonant frequency of the stator windings. In general, this reveals the envelope of the broadband impedance response. More specifically, the frequency $F_{res}$, peak magnitude $Z_{peak}=(L/Abs[C])^{1/2}$, width W=f (dielectric loss), and phase 0 of the resonant impedance have been identified with particular failure mechanisms. These parameters are illustrated in FIGS. 10a and 10b, which depict the ideal impedance 346 and phase 348 responses for the model shown in FIG. 6. Applicants believe that it will be possible to associate higher order harmonics and non-harmonic frequencies with these or other as yet undiscovered failure mechanisms.

Stator winding failure can be predicted based upon any one of several features of the impedance response or any combination thereof. The first approach, as described in detail in FIG. 11a, is to compare the measured broadband impedance response of the stator winding to a baseline response and use that information to identify specific failure mechanisms, estimate the amount of damage, and determine the susceptibility of the winding to further damage from high frequency waveforms. The second approach, as described in detail in FIG. 11b, is to calculate the total power dissipated into the stator winding insulation as an indicator of damage. Even absent one of the failure mechanisms listed in FIG. 9, the stator winding will dissipate power causing it to age naturally and eventually fail. The failure mechanisms merely accelerate the aging process in a previously unpredictable manner. These approaches provide a technician or computer with detailed information on which to base an accurate prediction of stator winding failure. As a result, the frequency of unexpected line shutdowns and the rejection of perfectly good motors are reduced.

In the first approach, a baseline impedance response is provided (step 350) as shown in FIG. 11 a. With new motors, the baseline can be a historical value stored in memory 167 or 195 (FIG. 3), a modeled value or the average of the lot from which the stator winding was drawn. Thereafter, each accepted new motor is tested to define its own baseline response or "birth certificate" that travels with the motor for its lifetime. Alternately, the lot average, historical, or modeled values could be used.

The measured broadband impedance response is compared to this baseline response (step 352) by processor 190.

With motors, if the difference between the baseline and measures values, either the entire envelope or specific parameters, exceeds a tolerance, the motor is rejected. This prevents motors whose power efficiencies are too low and expected lifetimes are too short from being introduced into the commercial market. Once in operation, deviations from the baseline response can be used to identify one or more of the failure mechanisms listed in FIG. 9 (step 354).

The various failure mechanisms will affect the impedance response in measurably different ways. For example, different changes in the overall envelope shape and the resonant frequency, peak and width over time and under different thermal conditions correspond to certain failure mechanisms. The ability to identify a particular failure mechanism will assist in assessing the amount of damage to the insulation, determining the susceptibility to further damage, and predicting when the winding will fail.

The magnitude of the deviations from baseline indicate the onset of insulation damage and, with certain failure mechanisms, indicate the amount of damage to date (step 356). Generally, the greater the deviation the greater the damage. The onset and amount of damage are both factors in predicting stator winding failure.

The measured impedance response and the trend over past measurements as calculated by the processor 190 (FIG. 3) indicate the susceptibility of the stator winding to further damage from high frequency waveforms (step 358). If the width of the impedance response has increased and the phase degraded to the point that either a power surge or continued exposure to high frequency waveforms would cause imminent failure the motor may be pulled from the line. The identification of the failure mechanism, the amount of damage and the susceptibility to further damage are all factors in predicting stator winding failure.

In the second approach illustrated in FIG. 11b, the power dissipated into either the winding or the stator metal core (step 360) is computed by measuring either the voltage across or the current flowing through the stator winding using current sensor 171 and/or voltage sensor 172 (FIG. 3). The processor 190 uses this information to calculate the impedance response which in turn is used to calculate the power dissipated in the insulation at each frequency. Finally, the processor 190 integrates the total power over the broadband frequencies. The power levels are then accumulated and stored in memory 167 over time (step 362) to estimate the total power dissipated into the insulation. The total is compared to a target value (step 364) to detect the onset of damage, estimate the amount of damage, and predict failure. The target value can be determined from historical data for similar motors. This approach has the advantage of being relatively simple and is not dependent upon identifying the failure mechanism. When the total power exceeds the target, the motor is pulled from the line. In some applications it may be desirable to use both approaches to analyze and predict stator winding failure.

By way of example and without loss of generality, cut winding, moisture, and thermal aging/cycling; specifically percolation and thermal ionization, failure mechanisms are described in FIGS. 12–17 to illustrate the invention. However, the broadband impedance response test will be applicable to additional failure mechanisms as they are discovered and characterized. These figures specifically illustrate the changes in broadband impedance response that pertain to onset, identification, and susceptibility. However, the general degradation in impedance and phase response will also increase the amount of power dissipated into the insulation. Most importantly none of the failure mechanisms discussed nor the damage caused by them would be observable at the low frequencies associated with normal motor operation.

Figure 12:
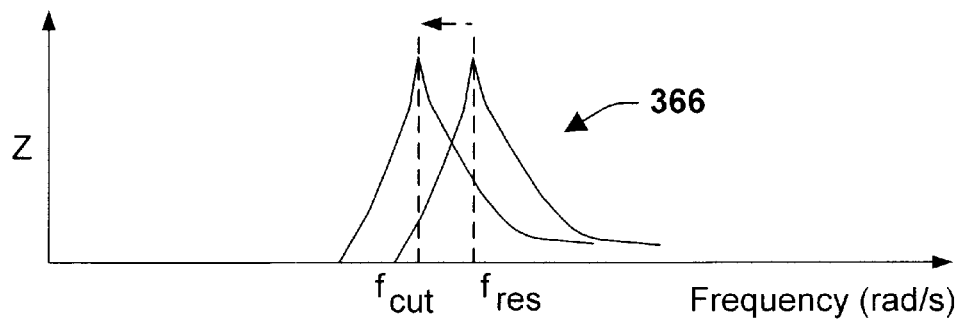
FIG. 12 is a plot illustrating a broadband impedance response of a stator winding when cut during manufacturing.

Occasionally, the stator winding is damaged when the motor is wound. The damage is in the form of small cuts in the insulation material and can happen literally anywhere in the windings. It is virtually impossible to detect such damage as there are kilometers of windings in the motor and a small cut does not alter the visual appearance in any obvious manner. However, even a small cut will alter the geometry of the winding in the sense that the effective area of the capacitance associated with the stator winding will increase. As shown in FIG. 12, this increase in capacitance will shift the peak of the impedance response 366 to a lower frequency $f_{out}$ relative to the baseline resonant frequency $f_{res}$. Because there is no significant loss introduced by such a cut, the magnitude, width, and phase of the peak will remain unchanged. Thus, when this pattern occurs, prior to use, a technician or computer can identify the defect as a cut winding. The magnitude of the frequency shift indicates the severity of the damage and will dictate whether the winding is rejected or accepted.

Figure 13A:
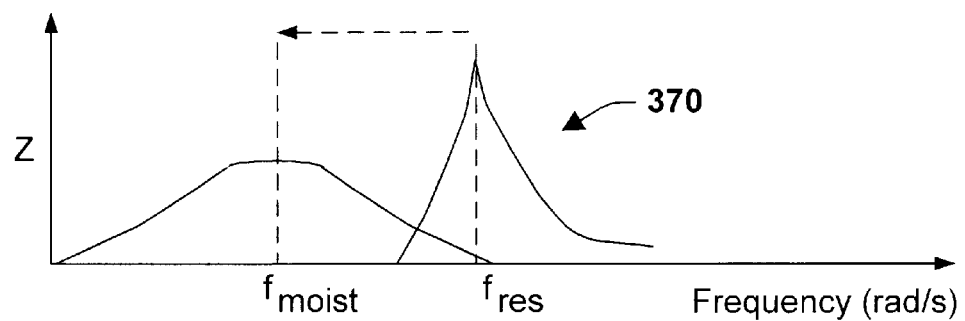
FIGS. 13a and 13b are respectively plots illustrating baseline broadband impedance and phase responses of the stator winding and its response when exposed to moisture.

In some applications, the motor will be exposed to moisture that permeates into the stator winding insulation. The moisture increases the dielectric constant of the insulation and makes it more lossy. As a result, the resonant frequency $f_{res}$ of the impedance response 370 shifts to a lower frequency $f_{moist}$ and its peak amplitude is reduced and widened relative to the baseline response as shown in FIG. 13a. A reduction in peak amplitude in the inductor to 10% of its original value with a corresponding widening by a factor a ten has been observed. When observed, this pattern is identified as the moisture failure mechanism. The extent of the shift and widening indicates how much moisture has permeated the insulation.

Figure 13B:
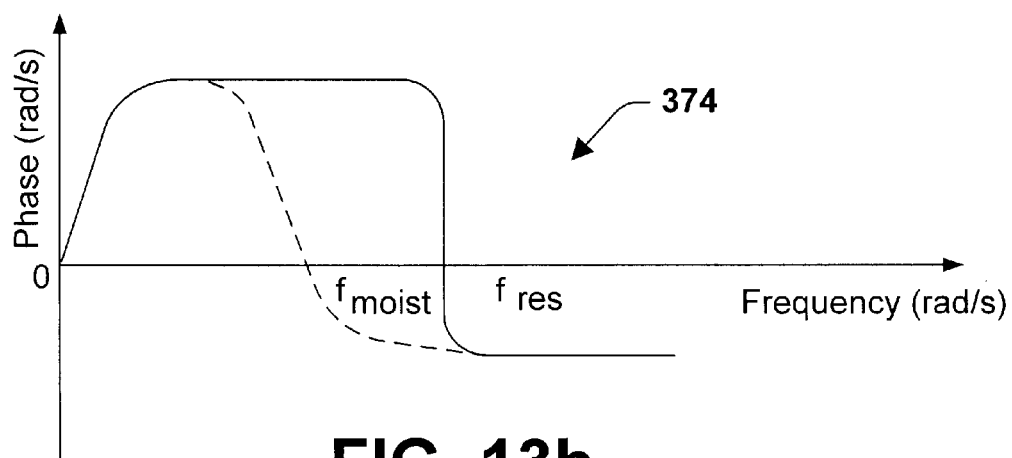

As shown in FIG. 13b, the phase response 374 has not only shifted to the lower frequency $f_{moist}$ relative to the baseline response but has softened the transition between its inductive and capacitive regions. Because the power dissipated is the cosine of the phase angle divided by the absolute value of the impedance, this softening coupled with the reduction and widening of the peak greatly increases power dissipation.

Thermal cycling can accelerate the aging effects of the stator winding insulation. Specifically, carbon and ceramic based insulation materials exhibit "percolation" and "thermal ionization" effects, respectively, that damage the insulation and increase power dissipation. Other materials that have impurities may exhibit thermal ionization as well.

With carbon based insulation, as the temperature increases above room temperature the polymer C—H bonds are broken and the hydrogen out gasses to the ambient environment. As hydrogen leeches out of the polymer, it forms carbon rich granular regions within and on the surface of the insulation leaving the internal structure somewhat altered. Because the granular regions are electrically connected at high temperatures they have a large surface area relative to the original uniform dielectric medium, and thus collectively have a much higher capacitance than the individual windings. However, at room temperature electrons cannot tunnel between granular regions and thus they are not electrically connected.

Figure 14:
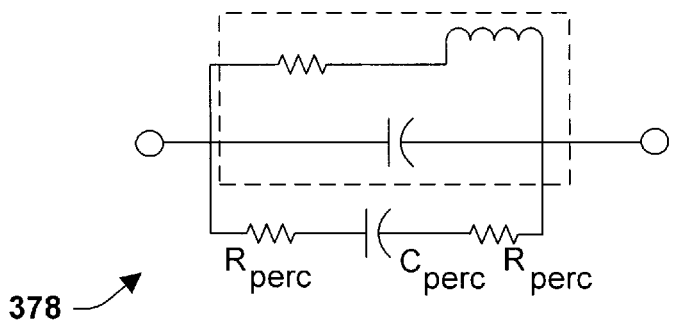
FIG. 14 is a zeroth order model of a percolation effect in the stator winding insulation.

The percolation effect is modeled by connecting a series R-C-R circuit 378 in parallel with the basic model 40 as shown in FIG. 14. The capacitor $C_{perc}$ represents the collective capacitance of the regions at temperature. The variable resistors $R_{perc}$ model the temperature varying properties of the path between granular regions. At low temperatures, $R_{perc}$ is very high so that the percolation capacitance is not seen. Conversely at high temperatures, $R_{perc}$ is very low so that the percolation capacitance dominates.

Figure 15A:
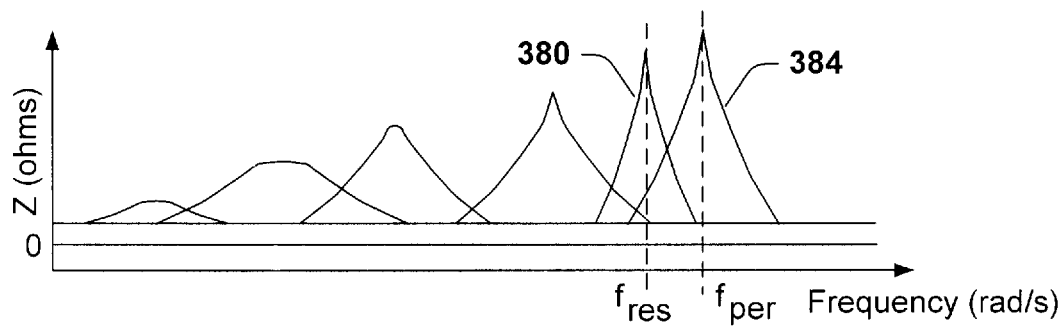
FIGS. 15a and 15b are respectively plots illustrating baseline broadband impedance and phase responses of a stator winding and its response when exhibiting percolation effects.
Figure 15B:
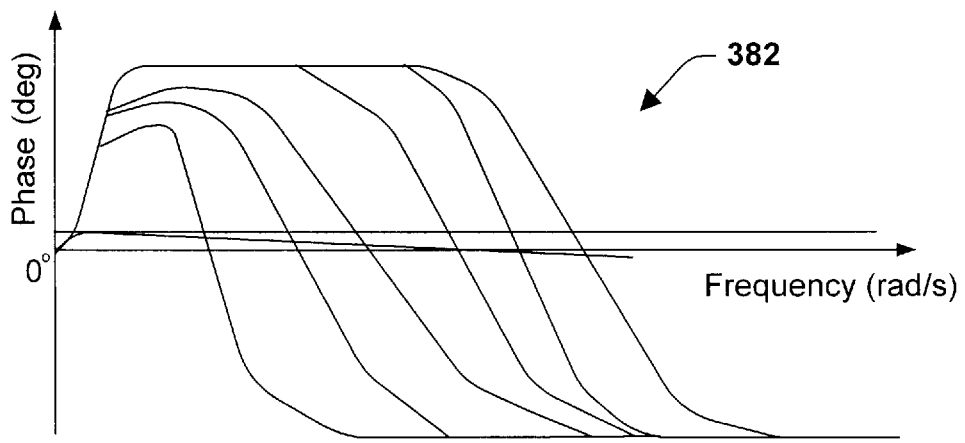

Thus, as shown in FIGS. 15a and 15b, at room temperature, approximately 26 degrees C., the stator winding exhibits baseline impedance and phase responses 380 and 382, respectively. As the temperature increases up to approximately 300 degrees C., the resistance between granular regions is reduced allowing electron tunneling to occur. As an increasing percentage of the current is diverted through this secondary conduction path, the resonant frequency shifts downward, the peak amplitude drops, the peak broadens, and the phase response degrades. As a result, the stator winding dissipates a lot of power into the insulation.

When the stator winding returns to room temperature, the electrons cannot tunnel between granular regions and the individual winding capacitance controls. Since some of the hydrogen irreversibly is out gassed, the insulation is altered permanently. This lowers the dielectric constant and shifts the frequency of the peak upwards to a frequency $f_{perc}$. The width of the peak and the phase transition are the same as their original values because even though the carbon regions are still present they are no longer capable of supporting current at these low temperatures.

The percolation failure mechanism can be identified by the distinctive irreversible upwards shift in the resonant frequency and/or by the changes in the impedance response during thermal cycling over a wide temperature range, 26–300 degrees C. The former can be done on or off line whereas the latter must be performed on line. The insulation is damaged both by the alterations made due to out gassing and by power dissipation. The magnitude of the irreversible shift is an indicator of the degree of alteration and total power dissipated in the insulation due to the percolation effect. If the insulation is weakened too much by out gassing or power dissipation it may fall.

Figure 16:
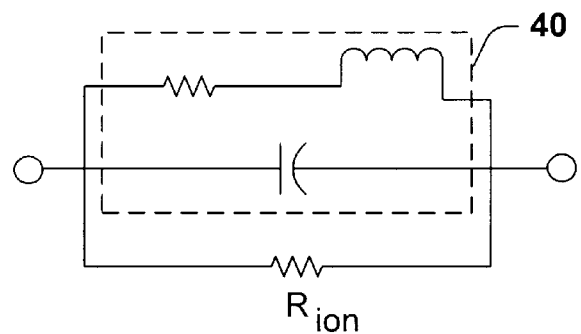
FIG. 16 is a zeroth order model of a thermal ionization effect in a ceramic stator winding insulation.

With some types of insulation such as ceramics, the impurities in the insulation become ionized when heated. The formation of thermally excited ions provides an additional conductive path, which is modeled by connecting a resistor $R_{ion}$ in parallel with the basic stator winding model 40 as shown in FIG. 16. In the winding tested, the additional path was not formed until the temperature exceeded approximately 155 degrees centigrade. Above that threshold temperature, the resistance of the path decreases rapidly with temperature and increases with frequency.

Figure 17A:
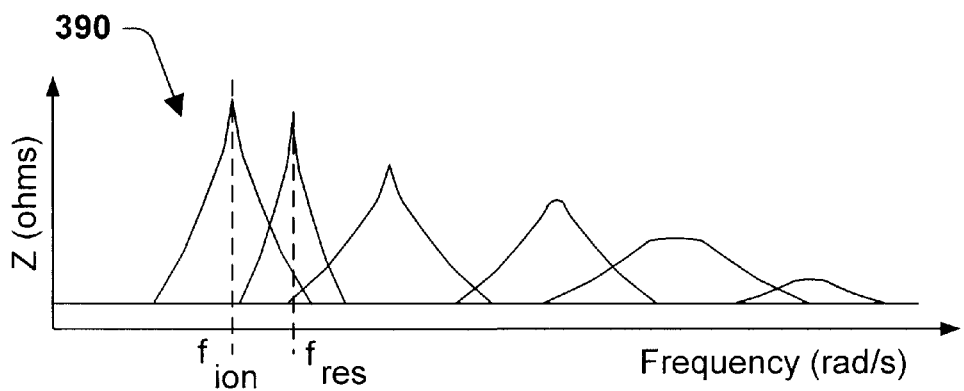
FIGS. 17a and 17b are respectively plots illustrating broadband impedance and phase response of a stator winding when exhibiting thermal ionization.
Figure 17B:
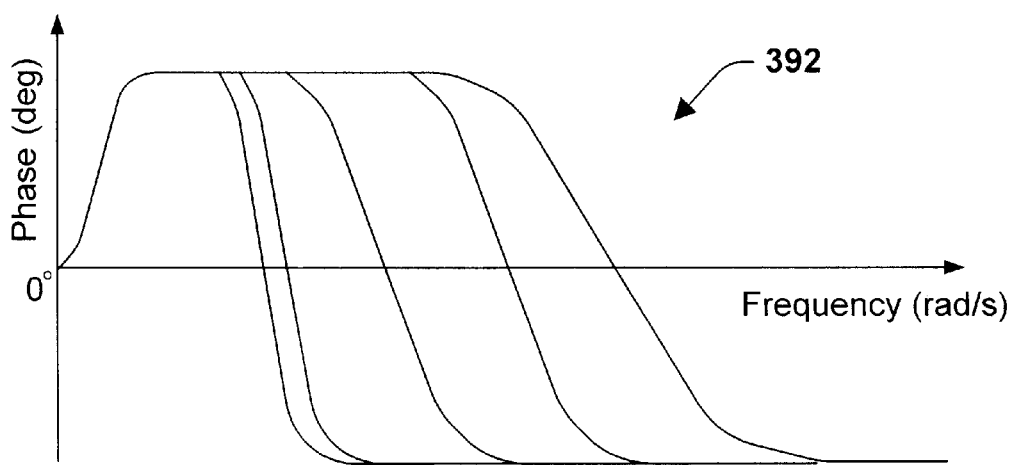

Above the threshold, the resistor $R_{ion}$ shorts out the individual winding capacitance thereby shifting the frequency $f_{res}$ of the resonant impedance 390 to a higher value as shown in FIG. 17a. As the temperature increases to 187 degrees, the peak drops to approximately 10% of its baseline value and widens by a factor of ten. The phase response 392 degrades as shown in FIG. 17b, which indicates that power is being dissipated into the insulation.

As the temperature is reduced back to room temperature, the impedance curve retraces its path with the peak frequency migrating back down with a corresponding reduction in width and increase in amplitude. However, at the room temperature, the impedance peaks at a lower frequency $f_{ion}$ than its original value $f_{res}$ with a greater amplitude and narrower width. This "final" state is only temporary. The impedance returns to its initial value cover the full range of frequencies within about a day.

The thermal ionization mechanism is identified in ceramic or similar insulation materials by 1) the upwards shift and corresponding widening of the peak impedance over a fairly narrow temperature range, 2) the return to a lower resonant frequency $f_{ion}$ at room temperature, and 3) the eventual return to the baseline values over the broadband. The stator winding is damaged by the power dissipated into the insulation during the thermal cycle. This effect must be monitored on-line and, like the others, can only be seen at high frequencies.

The electric motors to which these broadband impedance response techniques apply are typically either a sinewave motor or an inverter motor. The difference being how the two motors are driven. The sinewave motor is driven directly off the 60 Hz sinewave supplied by the power company. The inverter motor includes an inverter that converts the 60 Hz sinewave into a controllable-frequency output wave form for driving the motor. The present invention is suitable for use with both of these types of motors and others.

The invention has been described with reference to the preferred embodiments. Obviously, modifications and alterations will occur to others upon reading and understanding the preceding detailed description. It is intended that the invention be construed as including all such modifications alterations thereof and is only limited by the scope of the appended claims and their equivalents.

What is claimed is:

1. A system for predicting stator winding damage in a motor during operation, comprising:

a signal generator coupled to a power line providing power to the motor, the signal generator introducing a high frequency signal on the power line so as to probe stator windings of the motor at frequencies substantially above a normal operating range of the motor; and a sensor coupled to the power line, the sensor monitoring a broadband impedance response to facilitate determining changes in capacitance between individual stator windings which is indicative of at least one of dielectric breakdown and chances in winding geometry associated with insulation of the stator windings, the changes in capacitance being manifested in the broadband impedance response.

2. The system of claim 1, wherein the sensor includes a voltage sensor for sensing a voltage on the power line, and a current sensor for sensing a current on the power line.

3. The system of claim 2, further comprising a processor for calculating the broadband impedance of the power line based on the sensed voltage and the sensed current.

4. The system of claim 1, wherein the signal generator is an X-10 generator.

5. The system of claim 1, further including a low pass filter coupled to the power line, the low pass filter serving to filter out high frequency components of signals passed to the motor via the power line prior to the introduction of the high frequency signal from the signal generator.

6. The system of claim 1, wherein the high frequency signal is between 20 kHz and 1 MHz.

7. The system of claim 1, comprising three power lines providing power to the motor, wherein each of the three power lines provides a different phase of power.

8. The system of claim 7, wherein the sensor is coupled to each of the three power lines.

9. A device for detecting stator winding damage in a motor during operation, comprising:

a high frequency signal generator coupled to a power line providing power to the motor, the high frequency signal generator introducing a high frequency signal on the power line, the high frequency signal being substantially above a normal operating range frequency of the motor;

a current sensor coupled to the power line for sensing the current passing through the power line;

a voltage sensor coupled to the power line for sensing the voltage on the power line; and a processor for determining changes in capacitance between stator windings of the motor, the changes in capacitance being indicative of at least one of dielectric breakdown and changes in winding geometry associated with insulation of the stator windings;

wherein the processor makes such determination by analyzing a broadband impedance of the power line based on the sensed current and the sensed voltage.

10. The device of claim 9, wherein the high frequency signal generator is an X-10 chip.

11. The device of claim 10, wherein the power to the motor is provided via three power lines, each of the three power lines providing a different phase of power.

12. The device of claim 11, wherein the signal generator introduces the high frequency signal on each of the three power lines.

13. The device of claim 9, further comprising a low pass filter coupled to the power line, the low pass filter serving to filter out high frequency components of signals passed to the motor via the power line prior to the introduction of the high frequency signal.

14. The device of claim 9, wherein the high frequency signal is substantially 20 kHz or above.

15. A system for predicting stator winding damage in a motor during operation, comprising:

means for introducing a high frequency signal to a power line providing power to the motor, the high frequency signal being substantially above a normal operating range frequency of the motor;

means for analyzing a broadband impedance of the power line during introduction of the high frequency signal; and means for determining changes in capacitance between stator windings of the motor based on the analyzed broadband impedance, the changes in capacitance being indicative of at least one of dielectric breakdown and changes in winding geometry associated with insulation of the stator windings.

16. The system of claim 15, wherein the means for introducing a high frequency signal is an X-10 signal generator.

17. The system of claim 16, wherein the means for determining an impedance includes:

a current sensor coupled to the power line for sensing a current passing through the power line;

a voltage sensor coupled to the power line for sensing a voltage on the power line; and a processor coupled to the current sensor and the voltage sensor for calculating an impedance of the power line based on the sensed current and the sensed voltage.

18. A dynamoelectric machine diagnostic module adapted to be integrally mounted to a dynamoelectric machine and to facilitate predicting stator winding damage in the dynamoelectric machine during operation, comprising:

means for receiving current information from a current sensor;

means for receiving voltage information from a voltage sensor; and a microprocessor operatively coupled to the means for receiving current information and the means for receiving voltage information, the microprocessor processing the current information and the voltage information to facilitate analyzing a broadband impedance of the machine during introduction of a high frequency signal in order to determine changes in capacitance between stator windings of the motor, the high frequency signal being substantially above a normal operating range frequency of the motor, the changes in capacitance being indicative of at least one of dielectric breakdown and changes in winding geometry associated with insulation of the stator windings.

19. The module of claim 18 further including a communication device adapted to enable the microprocessor to communicate with other devices.

20. The module of claim 18, wherein the machine is one of a DC brush motor, a do brushless motor, a synchronous motor, a stepper motor, and a switch reluctance motor.

21. The module of claim 18, wherein the module is integrally mounted in a conduit box that is thermally isolated from heat generated from the an outer surface of the machine in order to protect the module from the heat.

22. The module of claim 18, wherein the microprocessor calculates impedance based on the current information and the voltage information.

23. The module of claim 22, wherein the microprocessor compares the calculated impedance with a predetermined value to determine an operating condition of the motor.

24. A system for determining an operating state of a dynamoelectric machine during operation, comprising:

a host computer operatively coupled to a network;

a high frequency signal generator for generating high frequency signals to be introduced to power lines feeding the machine, the high frequency signals being substantially above normal operating range frequencies of the motor;

a voltage sensor coupled to the power line for sensing voltage on the power line;

a current sensor coupled to the power line for sensing current passing through the power line;

a microprocessor operatively coupled to the voltage sensor and the current sensor, the microprocessor processing the sensed voltage and the sensed current to facilitate analyzing an impedance of the power line at frequencies above about $0.3 \times F_{res}$, wherein $F_{res}$=the resonant frequency of the stator windings, the microprocessor determining changes in capacitance between stator windings of the motor, the changes in capacitance being indicative of at least one of dielectric breakdown and changes in winding geometry associated with insulation of the stator windings; and a communications system adapted to enable communication between the microprocessor and the host computer.

25. The system of claim 24, wherein the signal generator is an X-10 chip.

26. The system of claim 24, wherein the machine is a motor.

27. A method of determining stator winding damage in a motor during operation, comprising the steps of:

introducing a high frequency signal on a power line providing power to the motor, the high frequency signal being substantially above a normal operating range frequency of the motor;

analyzing an impedance of the power line in conjunction with introducing the high frequency signal; and determining changes in capacitance between stator windings of the motor based on the analyzed impedance, the changes in capacitance being indicative of at least one of dielectric breakdown and changes in winding geometry associated with insulation of the stator windings.

28. The method of claim 27, further including the steps of:
sensing a voltage of the power line during introduction of the high frequency signal; and
sensing a current on the power line.

29. The method of 28 further including the step of calculating the impedance by a processor based on the sensed voltage and sensed current.

30. The method of claim 27, wherein the step of introducing a high frequency signal includes using an X-10 signal generator.

31. The method of claim 27, further comprising a step of filtering out high frequency signals from the power line prior to the step of introducing the high frequency signal.

32. The method of step 27, wherein the high frequency signal is substantially in the range of 80–150 kHz.

* * * * *